United States Patent
Koerner et al.

(10) Patent No.: US 12,480,702 B2
(45) Date of Patent: Nov. 25, 2025

(54) HEAT TRANSFER SYSTEMS FOR CRITICAL POWER APPLICATIONS

(71) Applicant: Caeli, LLC, Dallas, TX (US)

(72) Inventors: Matthew Douglas Koerner, Ashburn, VA (US); Brandon McDaniel, Flower Mound, TX (US); John A. Musilli, Jr., San Diego, CA (US)

(73) Assignee: Caeli, LLC, Dallas, TX (US)

( * ) Notice: Subject to any disclaimer, the term of this patent is extended or adjusted under 35 U.S.C. 154(b) by 668 days.

(21) Appl. No.: 17/662,184

(22) Filed: May 5, 2022

(65) Prior Publication Data

US 2022/0356838 A1 Nov. 10, 2022

Related U.S. Application Data

(60) Provisional application No. 63/201,631, filed on May 6, 2021.

(51) Int. Cl.
| | |
|---|---|
| *F25D 17/08* | (2006.01) |
| *F25B 27/02* | (2006.01) |
| *F25B 41/39* | (2021.01) |
| *F25D 3/00* | (2006.01) |
| *H05K 7/20* | (2006.01) |

(52) U.S. Cl.
CPC .............. *F25D 17/08* (2013.01); *F25B 27/02* (2013.01); *F25B 41/39* (2021.01); *F25D 3/005* (2013.01); *H05K 7/20745* (2013.01)

(58) Field of Classification Search
CPC ......... F25D 17/08; F25D 3/005; D25B 41/39; D25B 27/02; H05K 7/20745
See application file for complete search history.

(56) References Cited

U.S. PATENT DOCUMENTS

2005/0099770 A1 5/2005 Fink
2006/0150644 A1* 7/2006 Wruck ................ F24F 11/74
62/126

(Continued)

FOREIGN PATENT DOCUMENTS

GB 1518949 A 7/1978

OTHER PUBLICATIONS

MAN Energy Solutions, Urban Energy, https://www.man-es.com/docs/default-source/energy-storage/man-es_I2-broch_urban-energy_preview.pdf?sfvrsn=e9be4f6d_18, 86224 Augsburg, Germany, 32 pgs.

(Continued)

*Primary Examiner* — Elizabeth J Martin

(57) ABSTRACT

A system includes a turbine configured to exhaust an air stream. The system also includes a first coil configured to transfer thermal energy to the air stream when the air stream passes by or through the first coil, wherein the first coil is downstream of the turbine. The system also includes a second coil configured to transfer thermal energy to the air stream when the air stream passes by or through the second coil, wherein the second coil is downstream of the first coil. The system also includes a third coil configured to transfer thermal energy to the air stream when the air stream passes by or through the third coil, wherein the third coil is downstream of the second coil. The air stream is configured to cool one or more electronic components of a data center that is downstream of the third coil.

14 Claims, 10 Drawing Sheets

(56) References Cited

U.S. PATENT DOCUMENTS

| | | | |
|---|---|---|---|
| 2010/0024445 | A1* | 2/2010 | Cichanowicz ..... H05K 7/20727 62/86 |
| 2011/0094242 | A1 | 4/2011 | Koerner |
| 2011/0154842 | A1 | 6/2011 | Heydari et al. |
| 2011/0167814 | A1 | 7/2011 | Haynes |
| 2011/0239683 | A1 | 10/2011 | Czamara et al. |
| 2013/0047653 | A1 | 2/2013 | Keisling et al. |

OTHER PUBLICATIONS

Highview Power, "Cryogenic energy storage", copyright 2021, 5 pgs. https://highviewpower.com/technology/.

Linde Engineering, "Modular CO2 purification and liquefaction plants", copyright 2021, 4 pgs., https://www.linde-engineering.com/en/process-plants/co2-plants/co2-purification-and-liquefaction/modular-co2-plants/index.html.

Energy Storage Association, "Mechanical Energy Storage", copyright 2021, 5 pgs., https://energystorage.org/why-energy-storage/technologies/mechanical-energy-storage/#:~:text=Compressed%20Air%20Energy%20Storage%20(CAES,demand%20(peak%20load)%20periods.

IEM Power Systems, "About IEM Power Systems", copyright 2017, 3 pgs., https://www.iemps.com/company/about-iem-power-systems.

Scribd, "Turbo Expanders For Cold Production and Energy Recovery", copyright 2016, 16 pgs., https://www.scribd.com/document/452458382/Turbo-Expanders-for-cold-production-and-energy-recovery-booklet-pdf.

Hepburn, et al., "The technological and economic prospects for CO2 utilization and removal", https://www.nature.com/articles/s41586-019-1681-6#Tab2, Nov. 6, 2019, 11 pgs.

Scribd, "Hitech PowerPRO2-2016", copyright 2016, 3 pgs., https://www.scribd.com/document/347266893/HITEC-PowerPRO2700-2016-pdf.

ScienceDirect, "Sustainable hydrocarbon fuels by recycling CO2 and H2O with renewable or nuclear energy", copyright 2010, 23 pgs., https://www.sciencedirect.com/science/article/abs/pii/S1364032110001942?via%3Dihub.

ScienceDirect, "Production of cement-free construction blocks from industry wastes", copyright 2016, 3 pgs., https://www.sciencedirect.com/science/article/abs/pii/S0959652616311374.

Blue Planet Systems, "Permanent Carbon Capture", copyright 2021, 4 pgs., http://www.blueplanet-ltd.com/#technology.

Carbon Cure, "Sustainability in Concrete Makes Good Business Sense", copyright 2021, 9 pgs., https://www.carboncure.com/concrete producers/.

Solidia, "Solidia Solutions", copyright 2021, 1 pg., https://www.solidiatech.com/solutions.html.

Calix Global, "Cement & lime", copyright 2021, 3 pgs., https://www.calix.global/industries/cement-and-lime/.

Vox, "These uses of CO2 could cut emissions—and make trillions of dollars", copyright 2019, 18 pgs., https://www.vox.com/energy-and-environment/2019/11/13/20839531/climate-change-industry-co2-carbon-capture-utilization-storage-ccu.

Forbes, "Carbon Engineering—Taking CO2 Right Out Of The Air To Make Gasoline", copyright 2019, 6 pgs., https://www.forbes.com/sites/jamesconca/2019/10/08/carbon-engineering-taking-co2-right-out-of-the-air-to-make-gasoline/?sh=370a22c813cc.

Department of Energy, "2021 Climate Adaptation and Resilience Plan", copyright 2021, 7 pgs., https://www.energy.gov.

Chart, "Bulk Storage Tanks", copyright 2021, 11 pgs., https://www.chartindustries.com/Products/Bulk-Cryogenic-Tanks.

Universal Industrial Gases, "Large Tank Specifications", copyright 2003, 2 pgs., http://www.uigi.com/largetanks.html.

Integ Systems Corporation, "Critical Power and Environmental Specialists", copyright 2021, 4 pgs., https://www.integsystemscorp.com/pdf/Integ_Systems_Corp_Brochure.pdf.

Turbogaz, "Expander-Generator", copyright 2021, 5 pgs., https://turbogaz.com.ua/en/equipment/expander-generator.

Phoenix Equipment Corporation, "3.1 MW Steam Turbine Generator Set for Sale" 1 pg., https://www.phxequip.com/Multimedia/documents/plants/steam-turbine-generator-murray-3-1-mw-173.pdf.

Phoenix Equipment Corporation, "8 Steam Turbines & Steam Turbine Generators", copyright 2021, 7 pgs., https://www.phxequip.com/subcategory.222.0/power-generation-generators-steam-turbine-generators.aspx.

LNG Global, "WSCE Mini LNG Plants", copyright 2021, 5 pgs., https://www.lngglobal.com/mini-lng-plant-overview.

MAN Energy Solutions, "MGT6000 Single Shaft", https://www.man-es.com/docs/default-source/oil-and-gas-process-Industry-documents/mgt6000-1s-(single-shaft).pdf?sfvrsn=de156070_8, 86224 Augsburg, Germany, 4 pgs.

Science Based Targets, "Guidance for ICT Companies Setting Science Based Targets", https://sciencebasedtargets.org/resources/legacy/2020/04/GSMA_IP_SBT-report_WEB-SINGLE.pdf, 25 pgs.

PS&C Power, "Hybrid Rotary Uninterruptible Power Supply; Series XC", copyright 2021, 4 pgs., https://pscpower.com/large-hybrid-rotary-ups/.

SSS Gears Limited, "Power Generation", copyright 2021, 2 pgs., http://www.sssclutch.com/en/power-generation/.

Stirling Cryogenics, "Liquid Air Production Systems", copyright 2021, 4 pgs., https://www.stirlingcryogenics.eu/en/products/liquid-air-production-systems.

Calnetix Technologies, "Case Studies/The Heat to Power Solution" copyright 2021, 5 pgs., https://www.calnetix.com/system-integration/heat-power-systems.

International Search Report and Written Opinion issued Jan. 19, 2022 regarding International Application No. PCT/US2021/071804, 7 pages.

International Search Report and Written Opinion issued Aug. 11, 2022 regarding International Application No. PCT/US2022/072171, 7 pages.

Finocchiaro et al., "Advanced solar assisted desiccant and evaporative cooling system equipped with wet heat exchangers", Solar Energy, vol. 86, No. 1, Jan. 2012, pp. 608-618.

Extended European Search Report issued Feb. 19, 2025 regarding Application No. 22799815.0, 9 pages.

* cited by examiner

HEAT TRANSFER SYSTEMS FOR CRITICAL POWER APPLICATIONS

CROSS-REFERENCE TO RELATED APPLICATIONS AND PRIORITY CLAIM

This application claims priority under 35 U.S.C. § 119(e) to U.S. Provisional Patent Application No. 63/201,631 filed on May 6, 2021, which is hereby incorporated by reference in its entirety.

TECHNICAL FIELD

Embodiments of the present disclosure relate to critical power supply applications and, in particular, to systems and methods for heat transfer in a critical power supply system.

BACKGROUND

Facilities that operate power critical applications require a constant or near constant supply of electricity to ensure that their power critical applications can always be in operation. These facilities typically use a utility grid as a primary source of electricity and rely on one or more uninterruptible power supply or power generation systems to provide their applications with power in the event there is a loss of power from the primary utility grid. In generating power for use by such facilities, the uninterruptible power supply or power generation systems may use or generate a substantial amount of cold or hot liquid or gas, some of which is typically discarded as waste. However, thermal properties of such waste liquid or gas could have other beneficial uses.

SUMMARY

This disclosure provides systems and methods for heat transfer in a critical power supply system.

In a first embodiment, a system includes a turbine configured to exhaust an air stream. The system also includes a first coil configured to transfer thermal energy to the air stream when the air stream passes by or through the first coil, wherein the first coil is downstream of the turbine. The system also includes a second coil configured to transfer thermal energy to the air stream when the air stream passes by or through the second coil, wherein the second coil is downstream of the first coil. The system also includes a third coil configured to transfer thermal energy to the air stream when the air stream passes by or through the third coil, wherein the third coil is downstream of the second coil. The air stream is configured to cool one or more electronic components of a data center that is downstream of the third coil.

In a second embodiment, a method includes exhausting an air stream from a turbine. The method also includes transferring thermal energy from a first coil to the air stream when the air stream passes by or through the first coil, wherein the first coil is downstream of the turbine. The method also includes transferring thermal energy from a second coil to the air stream when the air stream passes by or through the second coil, wherein the second coil is downstream of the first coil. The method also includes transferring thermal energy from a third coil to the air stream when the air stream passes by or through the third coil, wherein the third coil is downstream of the second coil. The method also includes cooling one or more electronic components of a data center using the air stream, wherein the data center is downstream of the third coil.

In a third embodiment, a system includes a first turbine configured to generate and output a first exhaust stream at a first temperature. The system also includes a second turbine configured to generate and output a second exhaust stream at a second temperature higher than the first temperature. The system also includes a first duct configured to convey the first exhaust stream output by the first turbine. The system also includes a second duct configured to convey the second exhaust stream output by the second turbine. The system also includes a third duct coupled to the first duct and the second duct and configured to receive and mix at least portions of the first exhaust stream and the second exhaust stream into a third exhaust stream at a third temperature, the third duct having one or more vanes or baffles configured to promote mixing of the at least portions of the first exhaust stream and the second exhaust stream, the third duct further configured to output the third exhaust stream for cooling of one or more heat generating devices.

In a fourth embodiment, a system includes a turbine configured to generate and output an exhaust stream. The system also includes a first duct configured to receive the exhaust stream from the turbine and convey the exhaust stream to an outlet. The system also includes a second duct coupled to the first duct and configured to convey ambient air that is induced into the first duct due to a pressure and a velocity of the exhaust stream through the first duct. The system also includes a third duct coupled to the first duct and configured to convey return air from a data center that is induced into the first duct due to the pressure and the velocity of the exhaust stream through the first duct. The first duct is configured to mix the exhaust stream, the ambient air, and the return air to change a temperature of the exhaust stream to be within a predetermined temperature range.

Other technical features may be readily apparent to one skilled in the art from the following figures, descriptions, and claims.

DETAILED DESCRIPTION

The figures discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include anyone, more than one, or all of the features described here. Also, embodiments of this disclosure may additionally or alternatively include other features not listed here.

As discussed above, uninterruptible power supply systems are often used to provide facilities that operate power critical applications with power in the event there is a loss of power from the primary utility grid. In generating power for use by such facilities, the uninterruptible power supply or power generation systems may use or generate a substantial amount of cold or hot liquid or gas. For example, exhaust from the prime mover (i.e., the turbine) may include hot or cold gas, depending on the type of power supply system in operation. In many cases, some of the liquid or gas byproduct is typically discarded as waste. However, thermal properties of such waste liquid or gas could have other beneficial uses.

To address these and other issues, embodiments of the present disclosure recognize that waste streams from power supply systems can be reused, recaptured, recycled, or modified for use in a variety of applications. For example, thermal energy from waste streams can be used in cooling the facilities that operate the power critical applications. As another example, the thermal energy from waste streams can be used in district heating, district cooling, or a combination of these. As yet another example, the thermal energy from waste streams can be used to reduce overall fossil fuel consumption, reduce carbon dioxide generation, reduce thermal pollution, improve system efficiencies, or a combination of these. Other benefits will be apparent to those of skill in the art.

Figure 1:
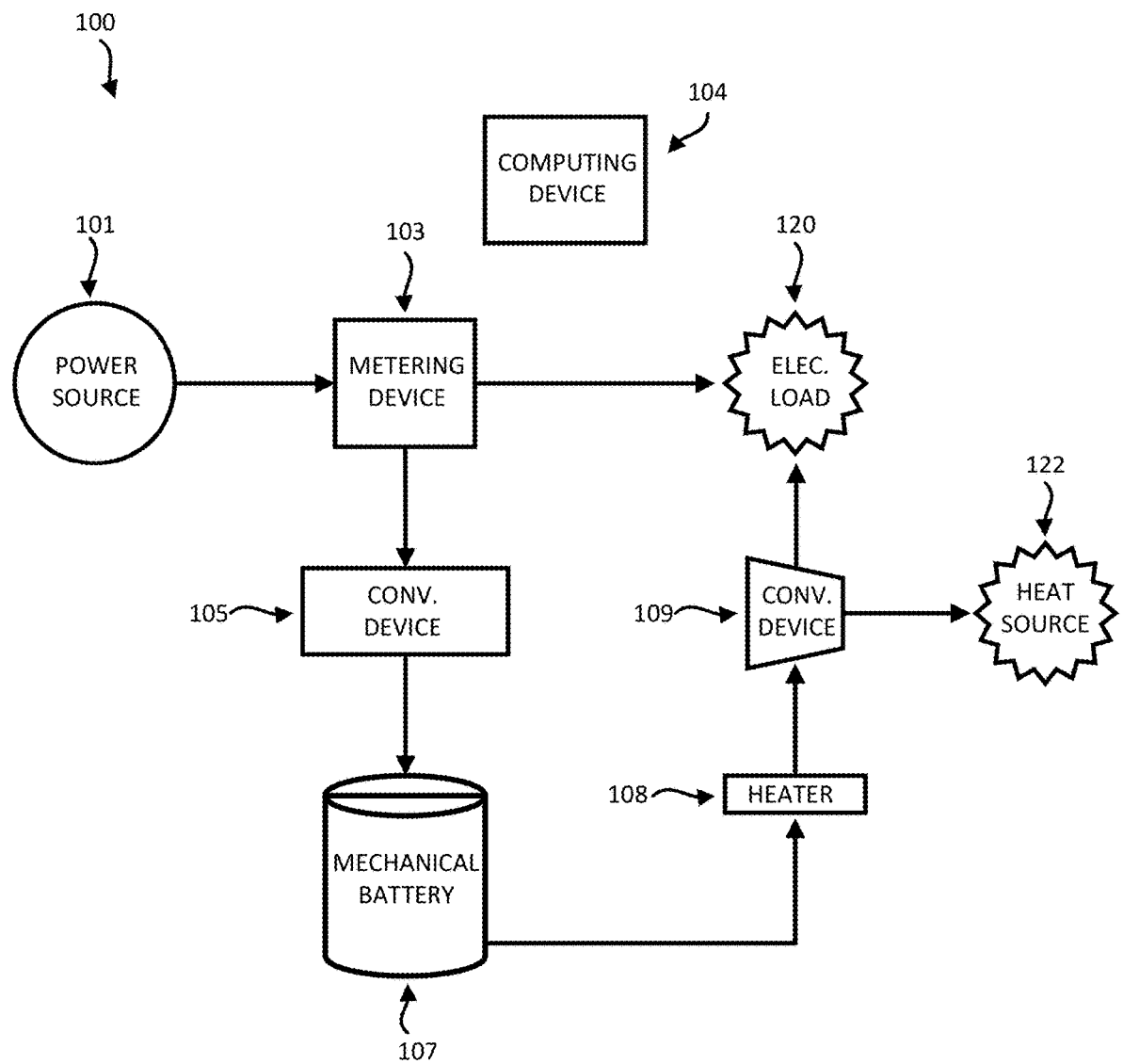
FIG. 1 illustrates an example power supply and cooling system in which one or more methods for heat transfer can be employed according to various embodiments of the present disclosure.

FIG. 1 illustrates an example power supply and cooling system 100 in which one or more methods for heat transfer can be employed according to various embodiments of the present disclosure. The embodiment of the system 100 shown in FIG. 1 is for illustration only. Other embodiments of the system 100 could be used without departing from the scope of this disclosure.

The system 100 may include a power source 101 that creates or receives electrical energy. The power source 101 may create or receive electrical energy from a renewable energy source. The power source 101 may create or receive electrical energy from wind power, solar power, tidal/wave power, or any other renewable energy source (the utility grid could also provide power through the same input). The system 100 may also receive electrical energy from a utility power grid. The utility power grid and the power source 101 may provide electrical energy to the system 100 through a same input of the system 100.

The system 100 may include a metering device 103. The metering device 103 may receive the electrical energy created or received by the power source 101, for example, during periods of time where the electrical energy is readily available and/or cost efficient and distribute the energy to different locations within the system 100. For example, the system 100 includes a computing device 104 to control the overall operation of the system 100. The computing device 104 may be connected to the metering device 103 and/or power source 101 to monitor the availability, reliability, and/or price of the electrical energy. For example, based on comparison of the availability, reliability, and/or price of the electrical energy to one or more baseline or threshold levels, the computing device 104 determines to convert the electrical energy for storage as potential mechanical energy. In some embodiments, the computing device 104 may be a service operated by a third party such as a person or a company. The computing device 104 may be housed and operated at a location different than the location at which the rest of system 100 is located. That is to say, the computing device 104 is not bound to a specific location.

The metering device 103 may supply electrical power to an electrical load 120. The electrical load 120 is discussed in greater detail below. The metering device 103 may supply electrical energy to an electrical-to-mechanical energy conversion device 105. The metering device may also be connected to an electricity grid to which the metering device 103 can provide electrical energy created by the power source 101 or receive electrical energy to supply to the electrical load 120 or the electrical-to-mechanical energy conversion device 105.

The electrical-to-mechanical energy conversion device 105 may receive electrical energy from the metering device 103 and convert the electrical energy to mechanical energy. For example, the electrical-to-mechanical energy conversion device 105 may comprise a gas-to-liquid conversion system. The gas-to-liquid conversion system may be configured to use electrical energy to convert a gas to a liquid. The gas-to-liquid conversion system may incorporate any known gas liquefaction system. For example, the gas-to-liquid conversion system may operate a Linde-Hampson cycle to convert gas to a liquid. The gas-to-liquid conversion system may repeatedly perform a cycle of compressing, cooling, and expanding a gas to reduce the temperature of the gas and convert the gas to a liquid. Accordingly, the gas-to-liquid conversion system may include compressors, coolers, heat exchangers, separators, expanders, and other equipment necessary for converting the gas to a liquid. The gas-to-liquid conversion system may be used to convert any of a number of gases to liquid. In various embodiments, the gas-to-liquid conversion system is used to convert ambient air of the system 100 to liquified air.

In other embodiments, the electrical-to-mechanical energy conversion device 105 may comprise an air compressor configured to use electrical energy to compress air so that it has a pressure greater than atmospheric pressure.

The electrical-to-mechanical energy conversion device 105 is not limited to a gas-to-liquid conversion system or an air compressor. Other embodiments of the electrical-to-mechanical energy conversion device 105 could be used without departing from the scope of this disclosure.

In some embodiments, the air liquefaction process can include an air separation process that separates air into at least oxygen and carbon dioxide ($CO_2$) components. The oxygen produced in the air separation process can be used as an oxidizer in a chemical element (e.g., iron (Fe)) bed to generate thermal energy that can be used for heating in the system 100. Carbon sequesters in the oxidation process can create an exothermic chemical reaction in the rapidly oxidizing chemical element bed. In some embodiments, the thermal energy from the oxidation can be used in lieu of natural gas or other carbon dependent heating sources.

In some embodiments, the air separation process can include multiple phases. In one phase, the air is filtered, compressed, and passed through a molecular sieve, which removes water vapor and separates out the $CO_2$. In another phase, the $CO_2$ is captured, and the compressed air is passed into the compression system. The process may be nearly energy neutral to capture the $CO_2$ and operate the compression system. The waste stream of the $CO_2$ capture removes the energy required for the compression system to reach the second stage of compression. This, in turn, can reduce the total cost of operation of the system 100, or reduce the cost of carbon capture, or both.

In some embodiments, the air compression process can include multiple phases. In one phase, the air is filtered, compressed, and passed through a molecular sieve, which removes water vapor and separates out the $CO_2$. In another phase, the $CO_2$ is captured, and the compressed air is passed into the compression system. The process may be nearly energy neutral to capture the $CO_2$ and operate the compression system. The waste stream of the $CO_2$ capture removes the energy required for the compression system to reach the second stage of compression. This, in turn, can reduce the total cost of operation of the system 100, or reduce the cost of carbon capture, or both.

The system 100 further includes a mechanical battery 107 (or mechanical energy storage device). The mechanical battery may store mechanical energy created by the electrical-to-mechanical energy conversion device 105. For example, when the electrical-to-mechanical energy conversion device 105 comprises a gas-to-liquid conversion system, the mechanical battery 107 may be an insulated container capable of containing the liquid gas generated by the gas-to-liquid conversion system. The container may be any container suitable for containing the liquified gas. The mechanical battery 107 may be a storage tank insulated and refrigerated to maintain a desired temperature of the liquid gas generated by the gas-to-liquid conversion system. In embodiments where the electrical-to-mechanical energy conversion device 105 is an air compressor, the mechanical battery 107 may be a storage tank configured to contain pressurized air. In some embodiments, the mechanical battery 107 can be a storage tank configured to contain both liquified air and compressed air. In some embodiments, the mechanical battery 107 can include one or more liquid or solid materials (e.g., liquid $CO_2$, dry ice, zeolite crystals, and the like) capable of thermochemically storing thermal energy (or cold or heat storage) from (or for use by) the electrical-to-mechanical energy conversion device 105. Other embodiments of the mechanical battery 107 could be used without departing from the scope of this disclosure.

The system 100 may include a heater or heat exchanger 108 (hereinafter referred to simply as "heater"). The heater 108 may heat the air delivered to the heater 108 from the mechanical battery 107. For example, in embodiments where the mechanical battery 107 stores liquified air, the heater 108 may heat the liquified air from the mechanical battery 107 to gasify the liquified air back to a gaseous state. The heater 108 is configured to make the system 100 more efficient by improving the gasification of the liquified air from the battery 107 prior to the air entering a power supply system 109. In various embodiments, a heater 108 may not be required for the gasification of the liquified air stored in the battery 107. In these embodiments, atmospheric heat acting on the liquified air as the liquified air travel from the battery 107 to the power supply system 109 may be enough to convert the liquified air to a gaseous state. For example, liquified air may be stored in the battery 107 below the temperature at which liquified air converts to its gaseous state (e.g., approximately −320 degrees Fahrenheit at or near atmospheric pressure). The heat from surround ambient air can convert liquified air to its gaseous state. In this example, the heater 108 is configured to accelerate the conversion of liquified gas from a liquid to a gas. Accordingly, one having skill in the art will understand that the heater 108 is not required for the system 100 but is configured to make the operation of system 100 more efficient.

The heater 108 may heat the air using any of a number of different sources. The heater 108 may generate heat specifically to heat the air. In some embodiments, the heater 108 may be a gas-fired heater or an electric heater configured to heat the air from the battery 107. In other embodiments, the heater 108 may be supplied heat from a heat source 122 of the system 100. The heat source 122 of the system 100 is discussed in further detail below. When the heater 108 uses heat generated by the heat source 122, the heater takes advantage of energy that would otherwise by wasted. As discussed in further detail below, the heat source 122 may be the servers, computer systems and other electronic devices of a data center that output heat during operation. The heat output by such a heat source would typically be lost during operation of the data center. The heater 108 may use the heat generated by the heat source 122 to heat the liquified air to convert the liquified air to a gaseous state or heat compressed air during decompression. Thus, the heater 108 is configured to make the system 100 more efficient by effectively using energy of the system that would otherwise be lost.

In embodiments where the mechanical battery 107 stores liquified air, the gasification of the liquified air results in an increase in pressure of the gaseous air due to the liquid expanding to a gaseous state. The air released from the battery 107 is released as liquified air at approximately atmospheric pressure. The liquified air is then heated to be converted to a gaseous state either solely with atmospheric heat or with the heater 108. During this heating process, the liquified air turns to a gaseous state and becomes pressurized above atmospheric pressure. The pressurized, or compressed, gaseous air is then supplied to the power supply system 109.

The power supply system 109 receives mechanical energy from the mechanical battery 107 and converts the mechanical energy to electrical energy. In various embodiments, the power supply system 109 provides uninterruptible or nearly-uninterruptible power supply to the electrical load 120. As used herein, uninterruptible or nearly-uninterruptible and derivatives thereof refer to a power supply that provides a constant power level within a time period on the order of milliseconds from when a backup power supply is needed and/or activated. In various embodiments, the power supply system 109 provides consistent power to the load 120 and includes mechanical energy storage mechanisms, such as a flywheel or chemical battery in combination or individually, as a backup instance of near-instantaneous power to provide uninterruptible or nearly-uninterruptible power supply or power generation, for example, in the event of power loss. In some embodiments, during periods of time where the electrical energy is not readily available and/or cost efficient, or when there is a failure of a primary energy source, the computing device 104 may determine to discharge and convert the stored mechanical energy in the battery 107 to electrical energy to power (and in some embodiments, cool) the electrical load 120. For example, the computing device 104 may, based on comparison of the availability, reliability, and/or price of the electrical energy to one or more baseline or threshold levels, determine to convert the stored potential mechanical energy into electrical energy to power the load 120. For example, the computing device 104 may be connected to and cause the power supply system 109 to discharge and convert the mechanical energy to electrical energy to supply the load 120.

In various embodiments, the power supply system 109 includes a compressed air-powered power generation unit configured to use the compressed air to create electrical energy. In various embodiments, the power supply system 109 includes a turboexpander or an expander turbine coupled to a generator to convert the mechanical energy of the compressed air to electrical energy. The power supply system 109 is not limited to the stated embodiments. Other embodiments of the power supply system 109 could be used without departing from the scope of this disclosure.

The electrical load 120 may be supplied with electrical energy from the power supply system 109. As previously discussed, the electrical load 120 may also be supplied with electrical energy that is created directly by the power source 101 from the metering device 103 or from a utility power grid. The electrical load 120 may be any component that consumes electrical energy. The electrical load 120 may be a building that houses electronic devices, such as a data center. Other embodiments of the electrical load 120 could be used without departing from the scope of this disclosure.

The heat source 122 may be a power-dense environment which outputs heat. The power-dense environment may be part of the electrical load 120. For example, when the electrical load 120 is a data center, as described above, the heat source 122 may be the servers, computer systems and other electronic devices of the data center that output heat during operation and may need to be cooled to ensure proper operation. Other embodiments of the heat source 122 could be used without departing from the scope of this disclosure.

The heat source 122 may be cooled by an exhaust of the power supply system 109. For example, when the power supply system 109 is a compressed air-powered turbine, as described above, the turbine converts compressed air from the mechanical battery 107 to electrical energy. In the process of converting the compressed air to electrical energy, the turbine exhausts cold air. The cold air exhausted by the turbine may be supplied to the heat source 122 to cool the heat source 122. The cooling can be performed directly or indirectly. An example of direct cooling is simply injecting the air from the exhaust of the turbine to the data center through one or more air ducts. An example of indirect cooling is cooling a fluid through a coil that is pumped to a cooling system of the data center, which cools the data center through the use of existing fans via cooling from the fluid circulated from the turbine exhaust air to liquid heat exchange. In some embodiments, the fluid is a non-freezing fluid at temperatures of, e.g., −220° F. to −6° F. Thermal energy from the data center hot aisle air can be transferred to the non-freezing fluid. Thus, the fluid can be used as a thermal conduit. Additional details of heat transfer systems for cooling the heat source 122 are described in greater detail below.

Figure 2A:
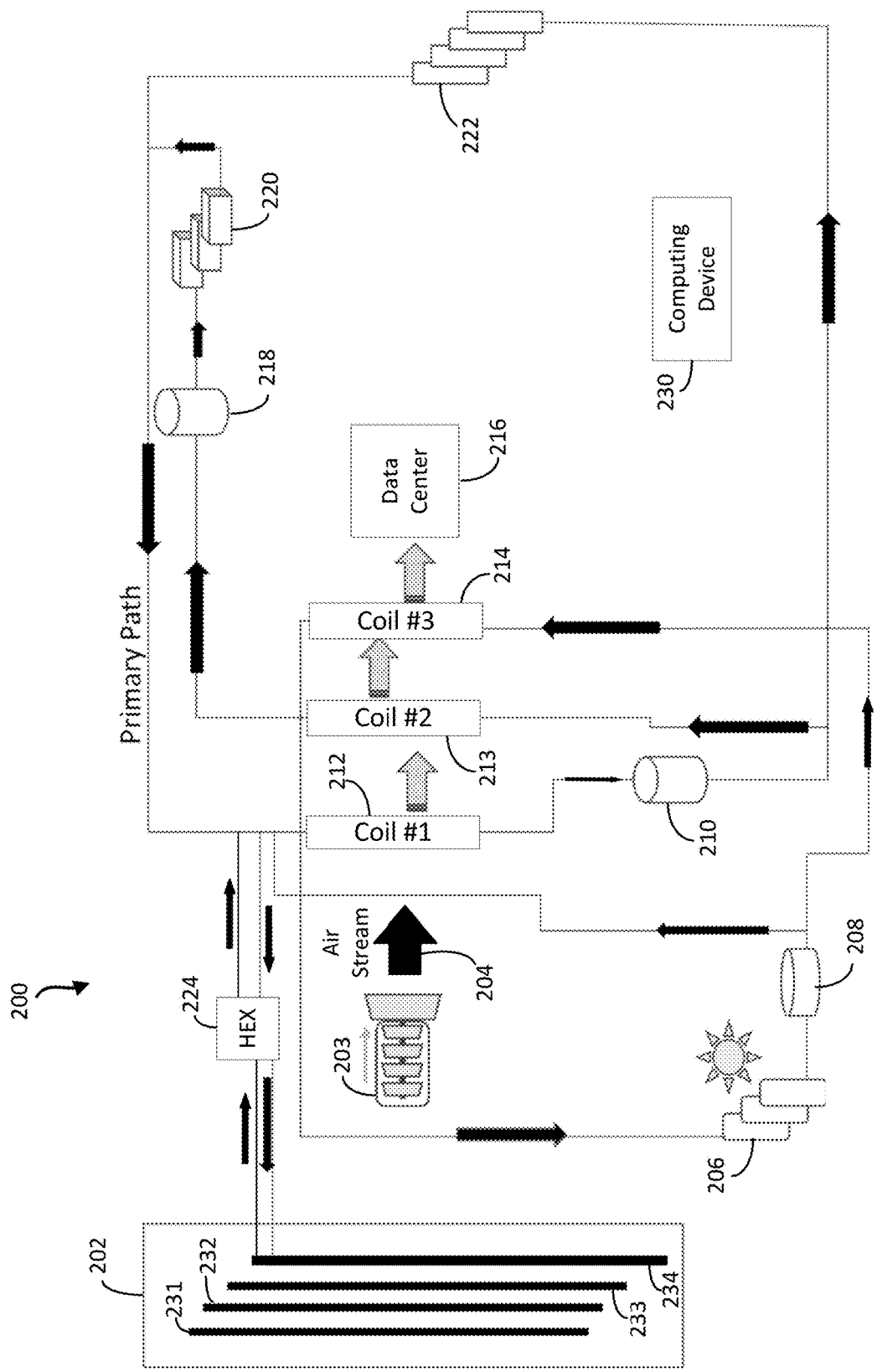
FIG. 2A illustrates an example of a heat transfer system for use in a power supply and cooling system according to various embodiments of the present disclosure.

FIG. 2A illustrates an example of a heat transfer system 200 for use in a power supply and cooling system according to various embodiments of the present disclosure. For ease of explanation, the heat transfer system 200 is described as being used in conjunction with the power supply and cooling system 100 of FIG. 1. Of course, this is merely one example. The heat transfer system 200 could be used with any other suitable system. Also, the embodiment of the heat transfer system 200 shown in FIG. 2A is for illustration only. Other embodiments of the heat transfer system 200 could be used without departing from the scope of this disclosure.

As illustrated in FIG. 2A, the heat transfer system 200 includes a stream 204 of cold air exhaust from a turbine 203 of a power generating system, such as the power supply system 109 of FIG. 1. For example, when the power supply system 109 is part of a compressed air energy system, the air stream 204 can have a temperature of approximately −150° F., although higher or lower temperatures are within the scope of this disclosure. Multiple coils, including coils 212-214, are disposed in series in the air stream 204. The coils 212-214 can be disposed in a large air duct through which the air stream 204 passes. In some embodiments, the duct is 8-10 feet across, although larger or smaller duct sizes are within the scope of this disclosure. Each of the coils 212-214 has fluid passing therethrough at a higher temperature than the air stream 204. Thus, the coils 212-214 act as heat exchangers in which thermal energy from the fluid(s) passing through the coils 212-214 add thermal energy to the air stream 204, thus warming the air stream 204 at each coil 212-214. The warmed air stream 204 can then be provided as cooling air to a data center 216. The data center 216 can represent (or be represented by) the electrical load 120 of FIG. 1. This heat exchange process will now be described in greater detail.

The coil 212 is the first coil encountered by the air stream 204, and thus the coil 212 receives the air stream 204 at its coldest temperature, e.g., −150° F., which represents the entering air temperature (EAT) of the air stream 204. Passing through the coil 212 is a fluid that is output from a close coupled cooling (CCC) coil 222. In some embodiments, the fluid includes a glycol mixture or another suitable fluid. The CCC coil 222 represents a coiling coil inside the data center 216. In some embodiments, the temperature of the fluid entering the coil 212 (i.e., the entering fluid temperature (EFT)) is approximately 120° F. As the relatively warm fluid passes through the coil 212, thermal energy from the fluid is transferred (e.g., through conduction, convection, or a combination of these) to the air stream 204, which causes the air stream 204 to be warmer and the fluid to be cooler. In some embodiments, the temperature of the fluid leaving the coil 212 (i.e., the leaving fluid temperature (LFT)) is approximately 80° F. In some embodiments, the fluid is output to a fluid storage 210, which acts as a reservoir for the fluid. As discussed below, the fluid in the fluid storage 210 can be made available for delivery to (and through) the coil 213. Due to the warming of the air at the coil 212, the leaving air temperature (LAT) of the air stream 204 is significantly higher than the −150° F. EAT. For example, the LAT of the air stream 204 leaving the coil 212 can be approximately −50° F.

The coil 213 is the next coil encountered by the air stream 204. That is, after the air stream 204 passes over or through the coil 212, the air stream 204 reaches the coil 213. The EAT of the air stream 204 at the coil 213 is approximately the same as the LAT of the air stream 204 at the coil 212, e.g., approximately −50° F. Passing through the coil 213 is fluid that is output from the fluid storage 210. The EFT of the fluid at the coil 213 is approximately 80° F. As the relatively warm fluid passes through the coil 213, thermal energy from the fluid is transferred to the air stream 204, which causes the air stream 204 to be additionally warmer and the fluid to be cooler. In some embodiments, the LFT of the fluid leaving the coil 213 is approximately 40° F. to 60° F. Thus, the fluid leaving the coil 213 is considered to be chilled fluid, which can be used for cooling in the data center 216. In some embodiments, the chilled fluid is output to a chilled fluid storage 218 (e.g., a storage tank), which acts as a reservoir for the chilled fluid. Due to the warming of the air at the coil 213, the LAT of the air stream 204 is significantly higher than the −50° F. EAT. For example, the LAT of the air stream 204 leaving the coil 213 can be approximately 10° F.

The coil 214 is the next coil encountered by the air stream 204 after passing over or through the coil 213. The EAT of the air stream 204 at the coil 214 is approximately the same as the LAT of the air stream 204 at the coil 213, e.g., approximately 10° F. Passing through the coil 214 is a fluid that is output from a heated fluid reservoir 208. The EFT of the fluid at the coil 214 is significantly warmer than ambient temperatures (e.g., approximately 200° F.). As the relatively warm fluid passes through the coil 214, thermal energy from the fluid is transferred to the air stream 204, which causes the air stream 204 to be additionally warmer and the fluid to be cooler. In some embodiments, the LFT of the fluid leaving the coil 214 is approximately 130° F. In some embodiments, the fluid is output to one or more heaters 206, which act to reheat the fluid. Due to the warming of the air at the coil 214, the LAT of the air stream 204 is significantly higher than the 10° F. EAT. For example, the LAT of the air stream 204 leaving the coil 214 can be approximately 70° F. to 104° F., which is a suitable temperature range for delivery to the data center 216. Once input to the data center 216, the air stream 204 can provide direct cooling to the data center 216. For example, the air stream 204 can be circulated around one or more heat-generating components (e.g., servers) within the data center 216.

The fluid passing through the coil 214 is part of a heated fluid loop that includes the coil 214, the heated fluid reservoir 208, and the heaters 206. In some embodiments, the heaters 206 are solar fluid heaters that use thermal energy received from the sun to heat the fluid (e.g., to approximately 200° F.). Such solar fluid heaters can include one or more solar panels, heat exchangers, or the like. In some embodiments, operation of the heaters 206 can be enhanced with concentrating mirrors, reflective surfaces, or reflective wells to increase fluid temperatures. Of course, other methods for heating (other than solar) could be used in the heaters 206, such as a hydrogen fueled heater. The fluid is first stored in the heated fluid reservoir 208, and later delivered to the coil 214. The fluid is then cooled by the air stream 204 as the fluid passes through the coil 214. Once output from the coil 214, the fluid is then returned to the heaters 206. The heaters 206 can include any number and configuration of solar heaters that are suitable for heating the fluid. In some embodiments, fluid in the heated fluid reservoir 208 can be occasionally or regularly recirculated through the heaters 206 to increase or maintain fluid temperature.

In some embodiments, a portion of fluid from the heated fluid reservoir 208 can also be used to heat the fluid entering the coil 212 if that fluid entering the coil 212 is not already suitably heated. For example, if the fluid leaving the CCC coil 222 is only 110° F., but the desired EFT at the coil 212 is 120° F., then heated fluid from the heated fluid reservoir 208 can be used to warm the fluid from the CCC coil 222 to the desired 120° F. EFT before the fluid enters the coil 212.

The fluid passing through the coils 212, 213 is part of another fluid loop that includes the coils 212, 213, the fluid storage 210, the fluid storage 218, and one or more air handlers 220 associated with the data center 216. As discussed above, the fluid is cooled to approximately 80° F. LFT in the coil 212 and is temporarily stored in the fluid storage 210, since flow rates in different parts of the fluid loop may be inconsistent. A portion of the fluid is later input to the coil 213 and cooled to a 40° F.-60° F. chilled fluid. The chilled fluid is temporarily stored in the fluid storage 218, and can be output to the air handlers 220, which operate to provide direct air cooling to the data center 216 or provide liquid to air direct cooling. At the air handlers 220, the chilled fluid acts to cool the warm air passing through the air handlers 220. This in turn heats the chilled fluid to a hotter temperature (e.g., 100° F.-120° F.). The fluid then mixes with fluid from the CCC coil 222, and the combined fluid is delivered to the coil 212.

The fluid passing through the CCC coil 222 is part of an additional fluid loop that includes the coil 212, the fluid storage 210, and the CCC coil 222. As discussed above, the fluid is cooled to approximately 80° F. LFT in the coil 212 and is temporarily stored in the fluid storage 210. A portion of the fluid in the fluid storage 210 is later delivered to the CCC coil 222, where the fluid is used for cooling of the data center 216. Due to a heat transfer process at the CCC coil 222, the LFT of the fluid leaving the CCC coil 222 is hotter (e.g., 100° F.-120° F.). The heated fluid is then returned to the coil 212.

Figure 2B:
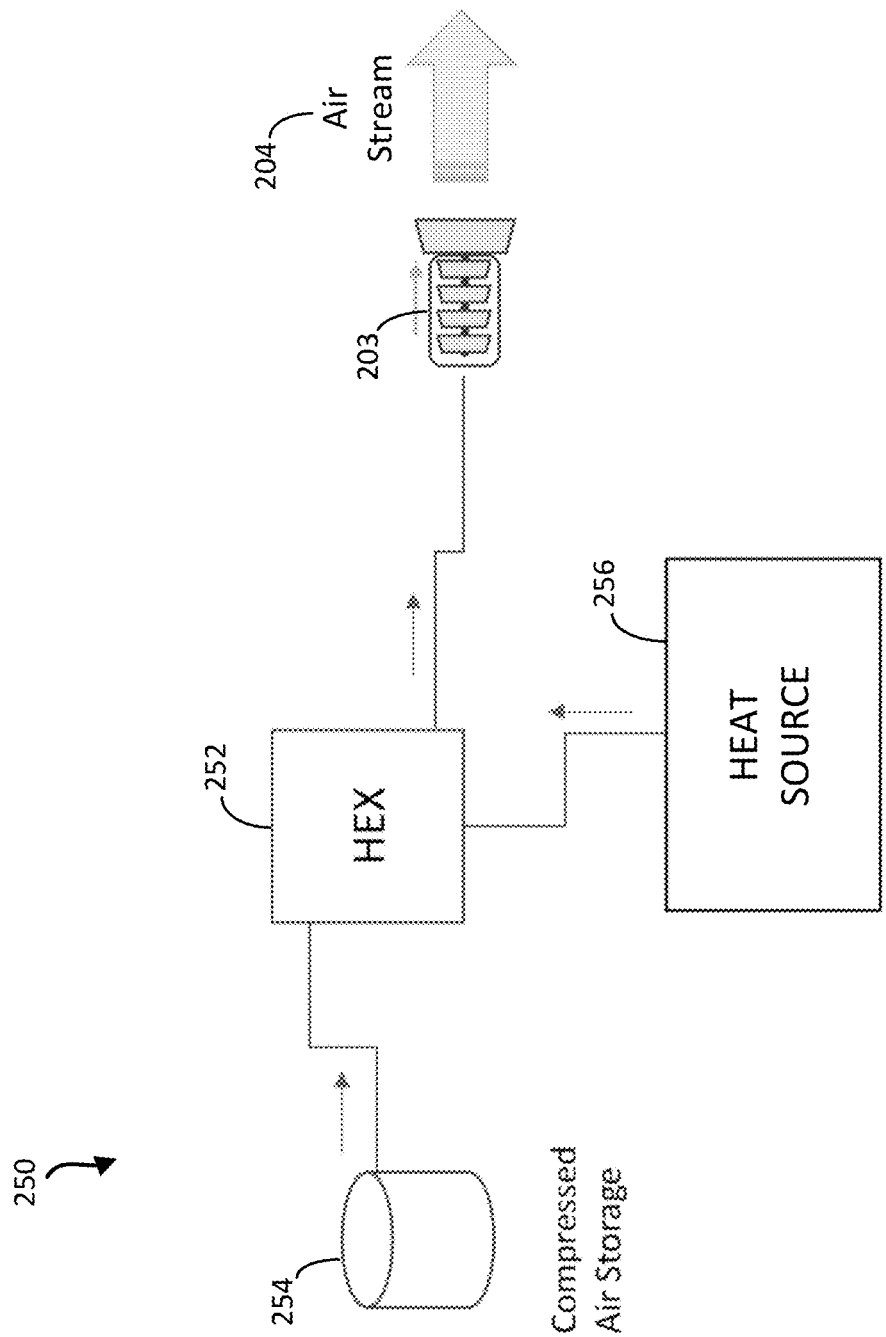
FIG. 2B illustrates portions of an example compressed air decompression heating cycle for use with the heat transfer system of FIG. 2A according to various embodiments of the present disclosure.

Any suitable method(s) or process(es) for heating air streams may be applied to the stored compressed air delivery path prior to entering the turbine 203. For example, FIG. 2B illustrates portions of an example compressed air decompression heating cycle 250 for use with the heat transfer system 200 according to various embodiments of the present disclosure. In some embodiments, the heating cycle 250 can be used to improve the efficiency of the mass flow rate of the turbine 203 in the heat transfer system 200.

As shown in FIG. 2B, the heating cycle 250 includes a heat exchanger 252 that receives compressed air from a compressed air storage 254 and thermal energy (heat) from a heat source 256. The compressed air storage 254 may represent (or be represented by) the mechanical battery 107 of FIG. 1 (in the form of a storage tank configured to contain pressurized air). The heat source 256 can include any suitable source of thermal energy, e.g., a hydrogen fueled heater, a solar heater, another combustible fuel heater, thermal transfer from an internal combustion engine exhaust and/or cooling system, or the like. In some embodiments, the heat source 256 can represent (or be represented by) the heater 108 of FIG. 1. The heat exchanger 252 uses the thermal energy from the heat source 256 to raise the temperature of the decompressing air from the compressed air storage 254 before providing the warmed air to the turbine 203. This can provide higher efficiency for operation of the turbine 203 with elevated air temperatures greater than 32° F.

In some embodiments, the heat transfer system 200 also includes a district heating and cooling system 202. The district heating and cooling system 202 includes utility-supplied hot and/or cold water that may be provided to facilities that use the water (e.g., a power generation facility), and conditioned water that is returned from the facilities. The district heating and cooling system 202 includes district domestic water 231, which, in some embodiments, may be at an ambient temperature (e.g., approximately 60° F.); district chilled water 232, which may be at approximately 40° F.-50° F.; district heat supply water 233, which may be at approximately 180° F., and district heat return water 234, which may be at approximately 90° F.-120° F. Of course, these temperatures are examples only; other embodiments could include hotter or colder temperatures.

In some embodiments, the district heating and cooling system 202 can be used as a heat sink or a heat source in the heat transfer system 200. For example, thermal energy in the fluid from the CCC coil 222 can be provided to the district heat return water 234 using a heat exchanger 224. As shown in FIG. 2A, one side of the heat exchanger 224 includes a fluid loop between the district heat return water 234 and the heat exchanger 224. The other side of the heat exchanger 224 includes a fluid loop between the heat exchanger 224 and the fluid line between the CCC coil 222 and the coil 212. Because the fluid from the CCC coil 222 is at a higher temperature than the temperature at the district heat return water 234 (e.g., approximately 120° F. versus approximately 90° F.-120° F.), the heat exchanger 224 can operate to transfer thermal energy from the fluid from the CCC coil 222 to the district heat return water 234.

In some embodiments, the input and output thermal values of the heat exchanger 224 are calculated from sensor data input into a computer algorithm. The heat exchanger 224 can be monitored using one or more sensors on the district heating and cooling system 202 and/or the heat exchanger 224 to provide precision delivery of thermal content to the district heating and cooling system 202 through automated computer control of one or more valves and actuators.

In some embodiments, the system 200 includes at least one computing device 230 provided to control operations of one or more components of the system 200. For example, the computing device 230 can determine EAT, EFT, and air flow and fluid flow rates at one or more of the coils 212-214, determine a desired LAT or LFT, calculate a change in one or more flow rates to achieve the desired LAT or LFT, and/or control one or more valves, three-way valves, actuators, dampers, manifolds, or the like to effect the change in the flow rate(s). In some embodiments, the computing device 230 may be a service operated by a third party such as a person or a company. The computing device 230 may be housed and operated at a location different than the location at which the rest of system 200 is located. That is to say, the computing device 230 is not bound to a specific location or configuration. While only one computing device 230 is shown in FIG. 2A, the system 200 could actually include multiple computing devices 230, each providing control to a different part of the system 200.

Figure 3:
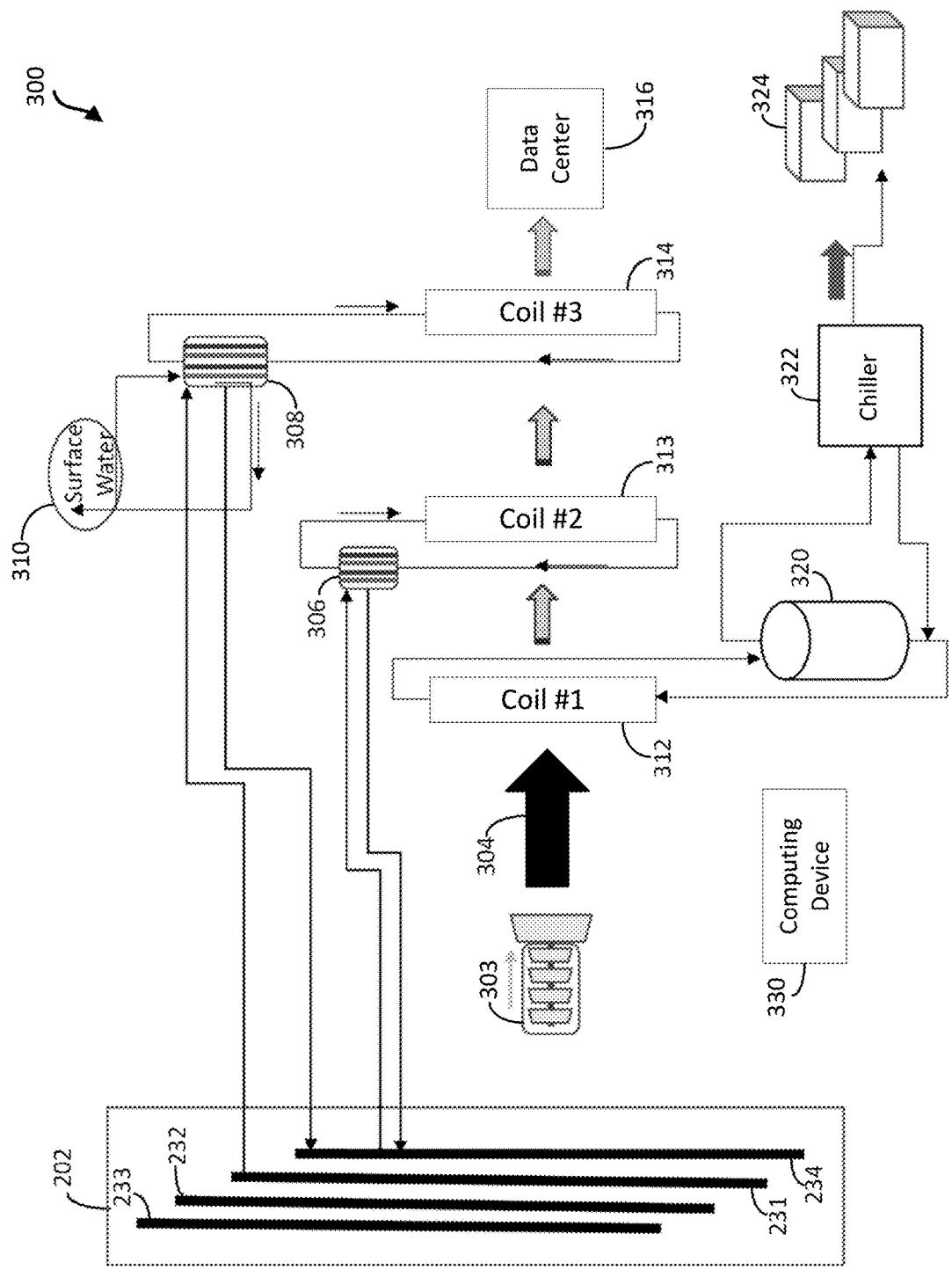
FIG. 3 illustrates another example of a heat transfer system for use in a power supply and cooling system according to various embodiments of the present disclosure.

FIG. 3 illustrates another example of a heat transfer system 300 for use in a power supply and cooling system according to various embodiments of the present disclosure. For ease of explanation, the heat transfer system 300 is described as being used in conjunction with the power supply and cooling system 100 of FIG. 1. Of course, this is merely one example. The heat transfer system 300 could be used with any other suitable system. Also, the embodiment of the heat transfer system 300 shown in FIG. 3 is for illustration only. Other embodiments of the heat transfer system 300 could be used without departing from the scope of this disclosure.

As illustrated in FIG. 3, the heat transfer system 300 includes a stream 304 of hot air exhaust from a turbine 303 of a power generating system, such as the power supply system 109 of FIG. 1. For example, when the power supply system 109 is part of a liquid air energy system, the air stream can have a temperature of approximately 150° F., although higher or lower temperatures are within the scope of this disclosure. Multiple coils, including coils 312-314, are disposed in series in the air stream 304. The coils 312-314 can be disposed in a large air duct through which the air stream 304 passes. In some embodiments, the duct is 8-10 feet across, although larger or smaller duct sizes are within the scope of this disclosure. Each of the coils 312-314 has fluid passing through the coil at a lower temperature than the air stream 304. Thus, the coils 312-314 act as heat exchangers in which thermal energy from the air stream 304 adds thermal energy to the fluid(s) passing through the coils 312-314, thus cooling the air stream 304 at each coil 312-314. The cooled air stream 304 can then be provided as cooling air to a data center 316. The data center 316 can represent (or be represented by) the electrical load 120 of FIG. 1. This heat exchange process will now be described in greater detail.

The coil 312 is the first coil encountered by the air stream 304, and thus the coil 312 receives the air stream 304 at its warmest temperature, e.g., 150° F., which represents the EAT of the air stream 304. Passing through the coil 312 is a fluid that is received from a fluid storage 320 and/or a chiller 322. In some embodiments, the EFT of the fluid entering the coil 312 is approximately 120° F. As the relatively cooler fluid passes through the coil 312, thermal energy from the warmer air stream 304 is transferred (e.g., through conduction, convection, or a combination of these) to the fluid, which causes the air stream 304 to be cooler and the fluid to be warmer. In some embodiments, the LFT of the fluid leaving the coil 312 is approximately 140° F. In some embodiments, the fluid is output back to the fluid storage 320, which acts as a reservoir for the fluid. Since fluid in a reservoir may be warmer near the top of the reservoir than near the bottom, the warm fluid may be input into the top of the fluid storage 320, while cooler fluid directed to the coil 312 may be taken from the bottom of the fluid storage 320. Due to the cooling of the air at the coil 312, the LAT of the air stream 304 is lower than the 150° F. EAT. For example, the LAT of the air stream 304 leaving the coil 312 can be approximately 140° F.

The coil 313 is the next coil encountered by the air stream 304. That is, after the air stream 304 passes over or through the coil 312, the air stream 304 reaches the coil 313. The EAT of the air stream 304 at the coil 313 is approximately the same as the LAT of the air stream 304 at the coil 312, e.g., approximately 140° F. Passing through the coil 313 is fluid that is output from a heat exchanger 306. The EFT of the fluid at the coil 313 is lower than the EAT of the air stream 304. In some embodiments, the EFT of the fluid could be approximately 90° F. As the relatively cooler fluid passes through the coil 313, thermal energy from the warmer air stream 304 is transferred to the fluid, which causes the air stream 304 to be cooler and the fluid to be warmer. In some embodiments, the LFT of the fluid leaving the coil 313 is approximately 110° F. In some embodiments, the fluid is output back to the heat exchanger 306, which is part of another fluid loop, as described in greater detail below. Due to the cooling of the air at the coil 313, the LAT of the air stream 304 is lower than the 140° F. EAT. For example, the LAT of the air stream 304 leaving the coil 313 can be approximately 130° F.

The coil 314 is the next coil encountered by the air stream 304. The EAT of the air stream 304 at the coil 314 is approximately the same as the LAT of the air stream 304 at the coil 313, e.g., approximately 130° F. Passing through the coil 314 is a fluid that is output from a heat exchanger 308. The EFT of the fluid at the coil 314 is lower than the EAT of the air stream 304. In some embodiments, the EFT of the fluid could be approximately 60° F.-70° F. As the relatively cooler fluid passes through the coil 314, thermal energy from the warmer air stream 304 is transferred to the fluid, which causes the air stream 304 to be cooler and the fluid to be warmer. In some embodiments, the LFT of the fluid leaving the coil 314 is approximately 90° F. In some embodiments, the fluid is output back to the heat exchanger 308, which is part of another fluid loop, as described in greater detail below. Due to the cooling of the air at the coil 314, the LAT of the air stream 304 is lower than the 130° F. EAT. For example, the LAT of the air stream 304 leaving the coil 314 can be approximately 70° F.-104° F., which is a suitable temperature range for delivery to the data center 316. Once input to the data center 316, the air stream 304 can provide direct cooling to the data center 316. For example, the air stream 304 can be circulated around one or more heat-generating components (e.g., servers) within the data center 316.

In some embodiments, the heat transfer system 300 also includes the district heating and cooling system 202, which includes the district domestic water 231, the district chilled water 232, the district heat supply water 233, and the district heat return water 234. In some embodiments, the district heating and cooling system 202 can be used as a heat sink or a heat source in the heat transfer system 300.

For example, as shown in FIG. 3, one side of the heat exchanger 306 includes a fluid loop between the district heat return water 234 and the heat exchanger 306. The other side of the heat exchanger 306 includes the fluid loop between the heat exchanger 306 and the coil 313. Because the fluid from the coil 313 is at a higher temperature than the temperature at the district heat return water 234 (e.g., approximately 110° F. versus approximately 90° F.), the heat exchanger 306 can operate to transfer thermal energy from the fluid from the coil 313 to the district heat return water 234.

As another example, one side of the heat exchanger 308 includes a fluid loop between the district domestic water 231, the heat exchanger 308, and the district heat return water 234. The other side of the heat exchanger 306 includes the fluid loop between the heat exchanger 308 and the coil 314. On the one side, the heat exchanger 308 can receive relatively cooler water (e.g., approximately 60° F.) from the domestic water 231. As discussed above, the heat exchanger 308 receives relatively warmer fluid (e.g., approximately 90° F.) from the coil 314. After thermal energy is exchanged in the heat exchanger 308, the water to be returned to the district heating and cooling system 202 is warmer than the domestic water 231. Thus, the warmer water can be returned to the district heat return water 234 or the domestic water 231 loop at a slightly elevated temperature.

In addition to, or as an alternative to, the fluid loop between the heat exchanger 308 and the district heating and cooling system 202, a fluid loop between the heat exchanger 308 and regional surface water 310 can be employed. The surface water 310 (which can be, e.g., a river, lake, ocean, or man-made pond) can provide relatively cooler water to be used in the heat exchanger 308.

As discussed above, the fluid passing through the coil 312 may be received at least in part from the chiller 322. The chiller 322 operates to produce chilled fluid that is delivered to one or more air handlers 324 associated with the data center 316. The air handlers 324 operate, using the chilled fluid from the chiller 322, to provide direct air cooling to the data center 316 or provide liquid to air direct cooling. The chiller 322 includes any suitable device or system for chilling fluid. In some embodiments, the chiller 322 includes an absorption chiller, an adsorption chiller, or a combination of these.

In some embodiments, the system 300 includes at least one computing device 330 provided to control operations of one or more components of the system 300. For example, the computing device 330 can determine EAT, EFT, and flow rates at one or more of the coils 312-314, determine a desired LAT or LFT, calculate a change in one or more flow rates to achieve the desired LAT or LFT, and/or control one or more valves, actuators, manifolds, or the like to effect the change in the flow rate(s). In some embodiments, the computing device 330 may be a service operated by a third party such as a person or a company. The computing device 330 may be housed and operated at a location different than the location at which the rest of system 300 is located. That is to say, the computing device 330 is not bound to a specific location or configuration. While only one computing device 330 is shown in FIG. 3, the system 300 could actually include multiple computing devices 330, each providing control to a different part of the system 300.

Although FIGS. 2A and 3 illustrate examples of heat transfer systems for use in a power supply and cooling system and related details, various changes may be made to FIGS. 2A and 3. For example, the various temperatures described in FIGS. 2A and 3 are merely examples; other embodiments could include different temperatures. Also, the number and arrangement of coils and other components are also merely examples. Various components in the heat transfer systems 200, 300 may be combined, further subdivided, replicated, rearranged, or omitted and additional components may be added according to particular needs.

In addition, various heat sources can be used in a single path or any combination of stages to improve the total heat content available for use in one or more portions of the systems 200, 300 (e.g., in one of the heat exchangers 224, 306, 308). Examples of such heat sources include compression heat from a liquefaction plant, compression heat from air compression, combustion of hydrogen or another combustible fuel, exhaust from an internal combustion engine, rejected heat from an internal combustion engine cooling system, ambient air vaporizers, exhaust from combustible fuel vessels, and the like.

In some embodiments, waste heat from a fuel cell can be captured and reused. For example, such waste heat can be applied to air entering the turbine 203, 303, to air at one or more intermediate stages of the turbine 203, 303, or to exhaust air exiting the turbine 203, 303. Warming of air during a turbine intermediate stage can prevent premature equipment failure, improve equipment efficiency, or a combination of these. Such waste heat could be used instead of burning carbon-based fuel.

In some embodiments, hydrogen can be used in the form of liquid or gas as a non-carbon combustible fuel heat source to heat compressed air directly or through heat exchangers during decompression. Such a process can produce a higher efficiency use of the air stream, produce a higher entering air temperature to reduce degradation and/or damage to internal components caused by thermal shock, or a combination of these. Hydrogen can also be used to heat liquid air directly or through heat exchangers during the turbine cycle to produce a higher efficiency use of the liquid air entering the turboexpander and between turbine stages.

In some embodiments that include one or more existing diesel generators, a generator remote radiator can be used as a heat source. For example, the radiator can be used as a heat source in a liquid-to-liquid transfer within a liquid air energy system. As another example, the radiator can be used as a heat source in a liquid-to-air transfer within a compressed air energy system. Generator exhaust can also be used in a similar manner. In some embodiments, exhaust stack carbon capture can be used to reduce or eliminate carbon dioxide production.

Figure 4:
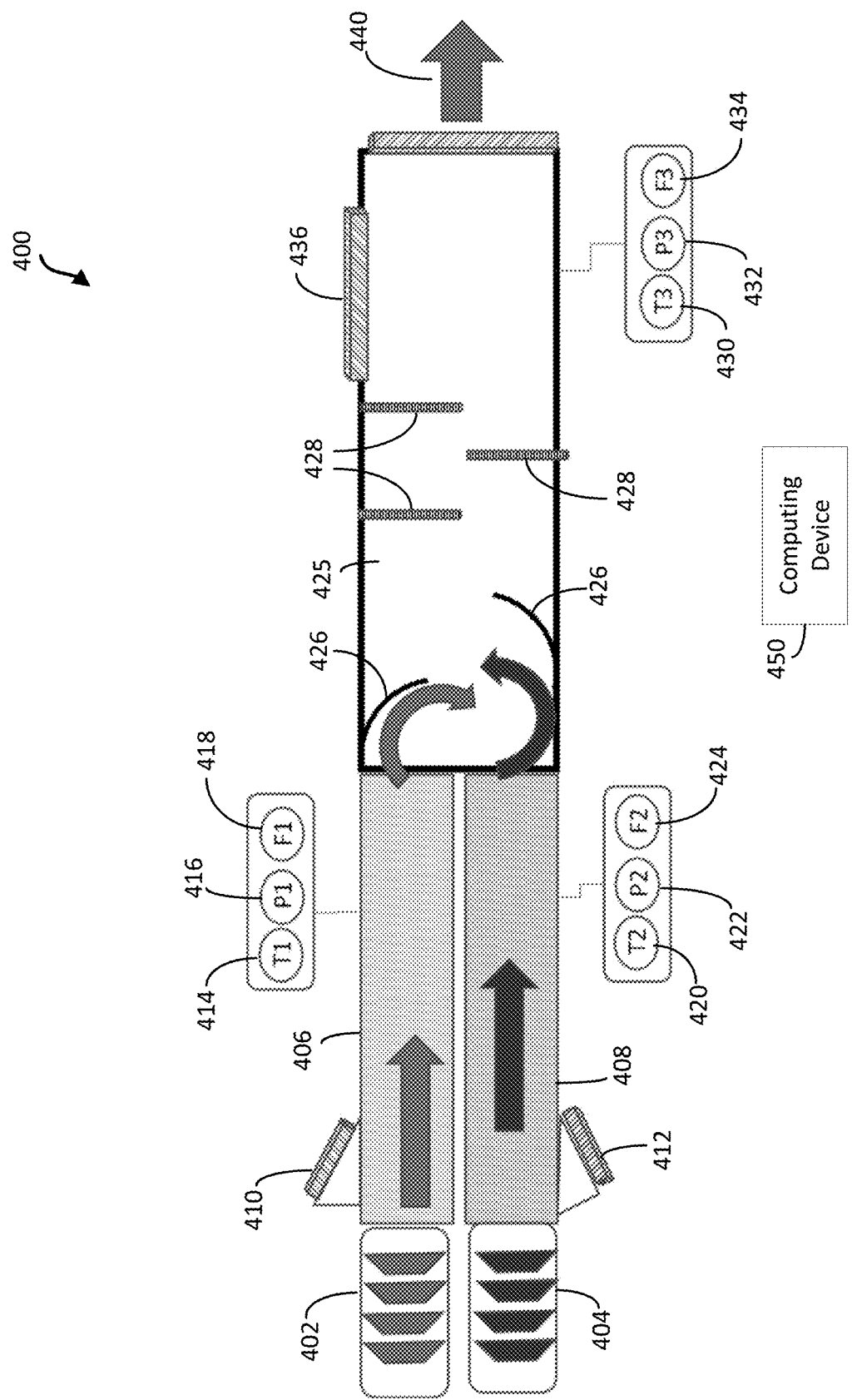
FIG. 4 illustrates an example of a hybrid compressed air/liquid air power supply and cooling system according to various embodiments of the present disclosure.

FIG. 4 illustrates an example of a hybrid compressed air/liquid air power supply and cooling system 400 according to various embodiments of the present disclosure. For ease of explanation, the system 400 is described as being used in conjunction with the power supply and cooling system 100 of FIG. 1. Of course, this is merely one example. The system 400 could be used with any other suitable system. Also, the embodiment of the system 400 shown in FIG. 4 is for illustration only. Other embodiments of the system 400 could be used without departing from the scope of this disclosure.

As illustrated in FIG. 4, the system 400 include two prime movers (or turbines) 402, 404. Each of the turbines 402, 404 can represent (or be represented by) the power supply system 109 of FIG. 1. The turbine 402 is part of a compressed air energy system and generates relatively cold exhaust at a temperature less than 30° F. In some embodiments, the exhaust stream of the turbine 402 is at a temperature of approximately −150° F. The cold exhaust stream initially flows through a duct 406 that includes a high-pressure waste gate 410 to expel excess exhaust. Sensors associated the duct 406 include a temperature sensor 414, a pressure sensor 416, and a flow sensor 418 for measuring the temperature, pressure, and flow rate, respectively, of the cold exhaust stream in the duct 406.

The turbine 404 is part of a liquid air energy system and generates relatively warm exhaust at a temperature greater than 30° F. In some embodiments, the exhaust stream of the turbine 402 is at a temperature of approximately 150° F. The warm exhaust stream initially flows through a duct 408 that includes a high-pressure waste gate 412 to expel excess exhaust. Sensors associated the duct 408 include a temperature sensor 420, a pressure sensor 422, and a flow sensor 424 for measuring the temperature, pressure, and flow rate, respectively, of the warm exhaust stream in the duct 408.

The paths of the ducts 406, 408 converge into a single duct 425, thereby forming a "Y" arrangement. In the duct 425, the cold exhaust stream from the duct 406 and the warm exhaust stream from the duct 408 mix to form a single exhaust stream. Dampers at the interface between the ducts 406 and 425 and at the interface between the ducts 408 and 425 can be operated to control the air flow from each duct 406, 408 into the duct 425. One or more vanes 426 and baffles 428 disposed within the duct 425 disturb the air flow, further causing mixture of the cold and warm exhaust streams. Sensors associated the duct 425 include a temperature sensor 430, a pressure sensor 432, and a flow sensor 434 for measuring the temperature, pressure, and flow rate, respectively, of the combined exhaust stream in the duct 425. If any of the measured properties (i.e., temperature, pressure, or flow rate) is not within a desired range, the dampers can be operated to change the ratio of warm and cold exhaust. In addition, a waste gate 436 can be operated to release non-specification waste exhaust from the duct 425. Exhaust air that is within the desired temperature, pressure, and flow rate range can be output through an outlet 440, and delivered to a data center (e.g., the electrical load 120 of FIG. 1) for cooling.

In some embodiments, the system 400 includes at least one computing device 450 provided to control operations of one or more components of the system 400. For example, the computing device 450 can obtain measurements from one or more of the sensors 414, 416, 418, 420, 422, 424, 430, 432, 434, determine desired temperatures and/or air flow rates, and control operation of one or more dampers, waste gates, or the like to effect the desired change(s). In some embodiments, the computing device 450 may be a service operated by a third party such as a person or a company. The computing device 450 may be housed and operated at a location different than the location at which the rest of system 400 is located. That is to say, the computing device 450 is not bound to a specific location or configuration. While only one computing device 450 is shown in FIG. 4, the system 400 could actually include multiple computing devices 450, each providing control to a different part of the system 400.

In some embodiments, a solar fluid heater (e.g., similar to the heater 206 in FIG. 2A) can be connected to one or more liquid-to-liquid heat exchangers at the turbine 404 to heat entering liquid air during and/or between stages of the turbine 404 to improve prime mover efficiency.

Figure 5:
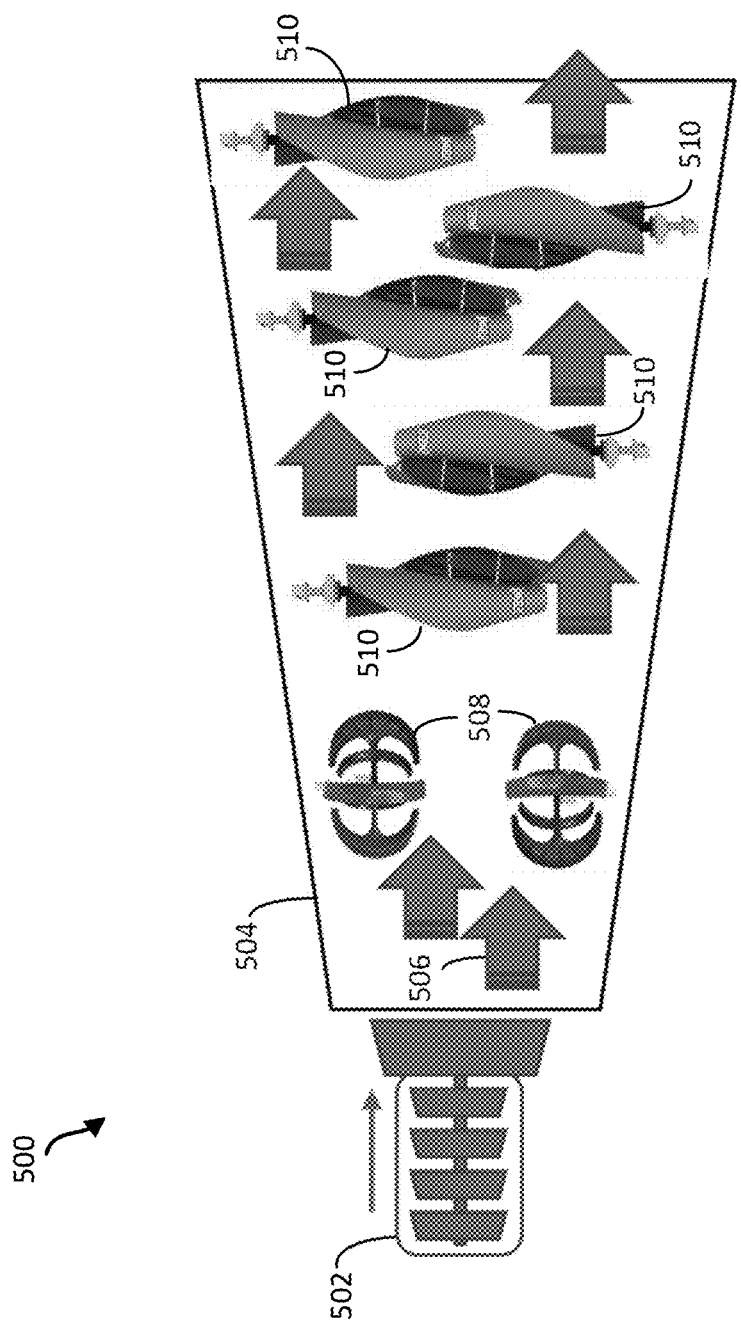
FIG. 5 illustrates an example system for generating power using turbine exhaust according to various embodiments of the present disclosure.

FIG. 5 illustrates an example system 500 for generating power using turbine exhaust according to various embodiments of the present disclosure. For ease of explanation, the system 500 is described as being used in conjunction with one or more of the systems described in FIGS. 1 through 4. Of course, this is merely one example. The system 500 could be used with any other suitable system. Also, the embodiment of the system 500 shown in FIG. 5 is for illustration only. Other embodiments of the system 500 could be used without departing from the scope of this disclosure.

As shown in FIG. 5, the system 500 includes a turbine 502. The turbine 502 can represent (or be represented by) the power supply system 109 of FIG. 1. In some embodiments, the turbine 502 is part of a compressed air energy system, similar to the turbine 402 of FIG. 4. In other embodiments, the turbine 502 is part of a liquid air energy system, similar to the turbine 404 of FIG. 4. During operation, the turbine 502 generates an exhaust stream 506 that flows through a duct 504. Depending on the type of system, the exhaust stream 506 can have a velocity exceeding 50 miles per hour (MPH) and a pressure exceeding 20 pounds per square inch absolute (psia). Of course, these values are merely examples; other values could be higher or lower and are within the scope of this disclosure.

Inside the duct 504 and in the path of the exhaust stream 506 are multiple power generation devices, including one or more pinwheel generators 508 and one or more turbine generators 510. As the exhaust stream 506 flows by each of the generators 508, 510, the generators 508, 510 spin, thereby generating small amounts of power. Such power can be used to operate control devices that require little power, such as actuators, valves, sensors, and the like. As an additional benefit, the generators 508, 510 act as obstacles that can lower the velocity and pressure of the exhaust stream 506. This may be useful for changing the pressure and air flow to be within a desired range, such as for flow through a coil (e.g., the coils 212-214, 312-314 of FIGS. 2A and 3) or through one or more downstream ducts (e.g., the ducts 406, 408, 425 of FIG. 4). Additionally, or alternatively, the duct 504 can include one or more wheels, vanes, blades, or the like, that move, vibrate, or rotate due to the movement of the exhaust stream 506. Such wheels, vanes, blades, or the like can, in turn, actuate or operate one or more shafts, gears, pumps, or other devices that are capable of movement. For example, a spinning vane in the duct 504 can operate a hydraulic pump that moves one or more of the fluids described in FIGS. 2A and 3.

Figure 6:
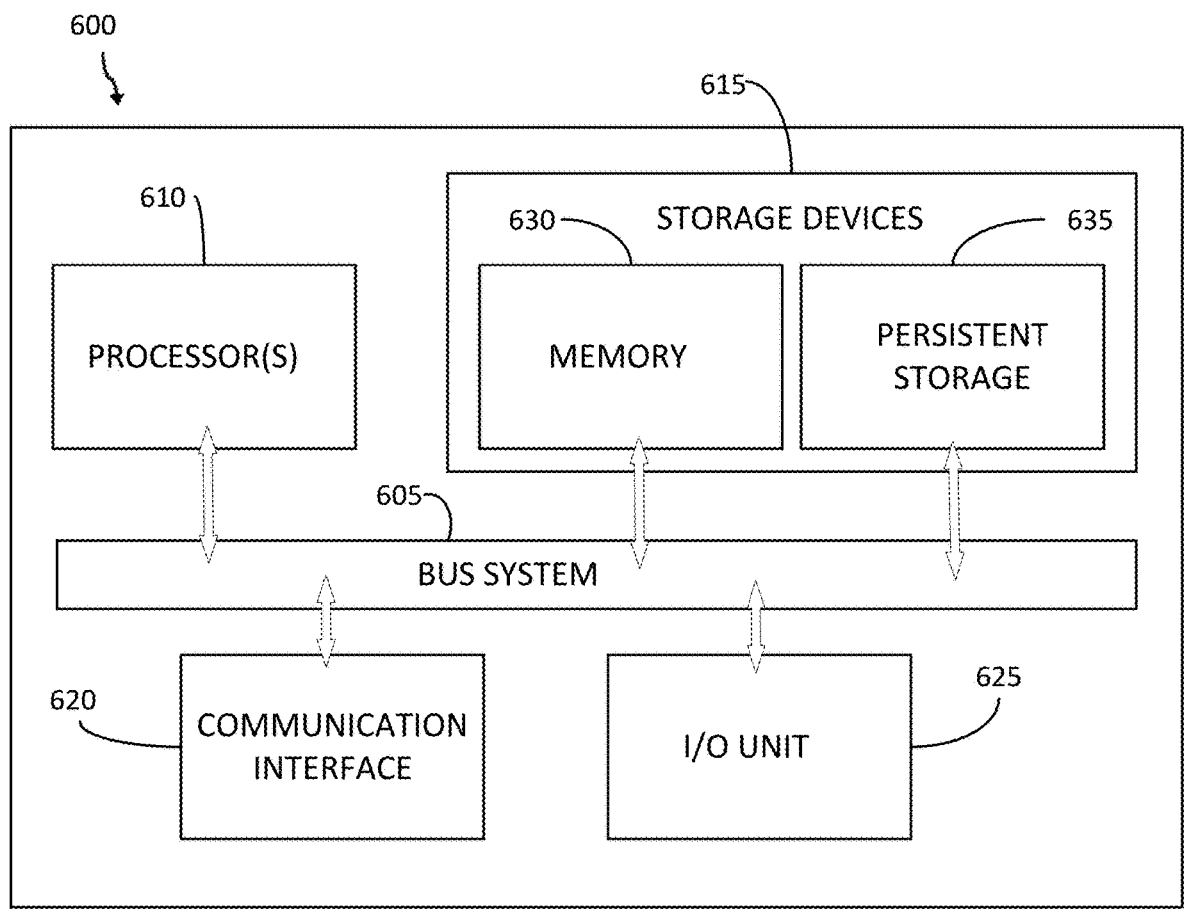
FIG. 6 illustrates an example of a computing device in a power supply and cooling system according to various embodiments of the present disclosure.

FIG. 6 illustrates an example of a computing device 600 in a power supply and cooling system according to various embodiments of the present disclosure. The computing device 600 can represent any of the computing devices 104, 230, 330, 450 discussed above in FIGS. 1 through 4. The computing device 600 can be configured to control any of the operations discussed herein, including operations in the methods discussed below.

As shown in FIG. 6, the computing device 600 includes a bus system 605, which supports communication between processor(s) 610, storage devices 615, communication interface (or circuit) 620, and input/output (I/O) unit 625. The processor(s) 610 executes instructions that may be loaded into a memory 630. The processor(s) 610 may include any suitable number(s) and type(s) of processors or other devices in any suitable arrangement. Example types of processor(s) 610 include microprocessors, microcontrollers, digital signal processors, field programmable gate arrays, application specific integrated circuits, and discrete circuitry.

The memory 630 and a persistent storage 635 are examples of storage devices 615, which represent any structure(s) capable of storing and facilitating retrieval of information (such as data, program code, and/or other suitable information on a temporary or permanent basis). The memory 630 may represent a random-access memory or any other suitable volatile or non-volatile storage device(s). The persistent storage 635 may contain one or more components or devices supporting longer-term storage of data, such as a read-only memory, hard drive, Flash memory, or optical disc. For example, persistent storage 635 may store one or more databases of data, standards data, results, data, client applications, etc.

The communication interface 620 supports communications with other systems or devices. For example, the communication interface 620 could include a network interface card or a wireless transceiver facilitating communications over the system 200 or system 100. The communication interface 620 may support communications through any suitable physical or wireless communication link(s). The I/O unit 625 allows for input and output of data. For example, the I/O unit 625 may provide a connection for user input through a keyboard, mouse, keypad, touchscreen, or other suitable input devices. The I/O unit 625 may also send output to a display, printer, or other suitable output devices.

Although FIG. 6 illustrates one example of a computing device 600, various changes may be made to FIG. 6. For example, various components in FIG. 6 could be combined, further subdivided, or omitted and additional components could be added according to particular needs. As a particular example, while depicted as one system, the computing device 600 may include multiple computing systems that may be remotely located. In another example, the computing device 600 may be a personal electronic device, such as, a phone, tablet, or laptop, or provide or update a user interface, e.g., via a software application, or other communications interface to a personal electronic device for control, management, information, and or access to the computing device 600 and/or any aspects of the systems disclosed herein.

Figure 7:
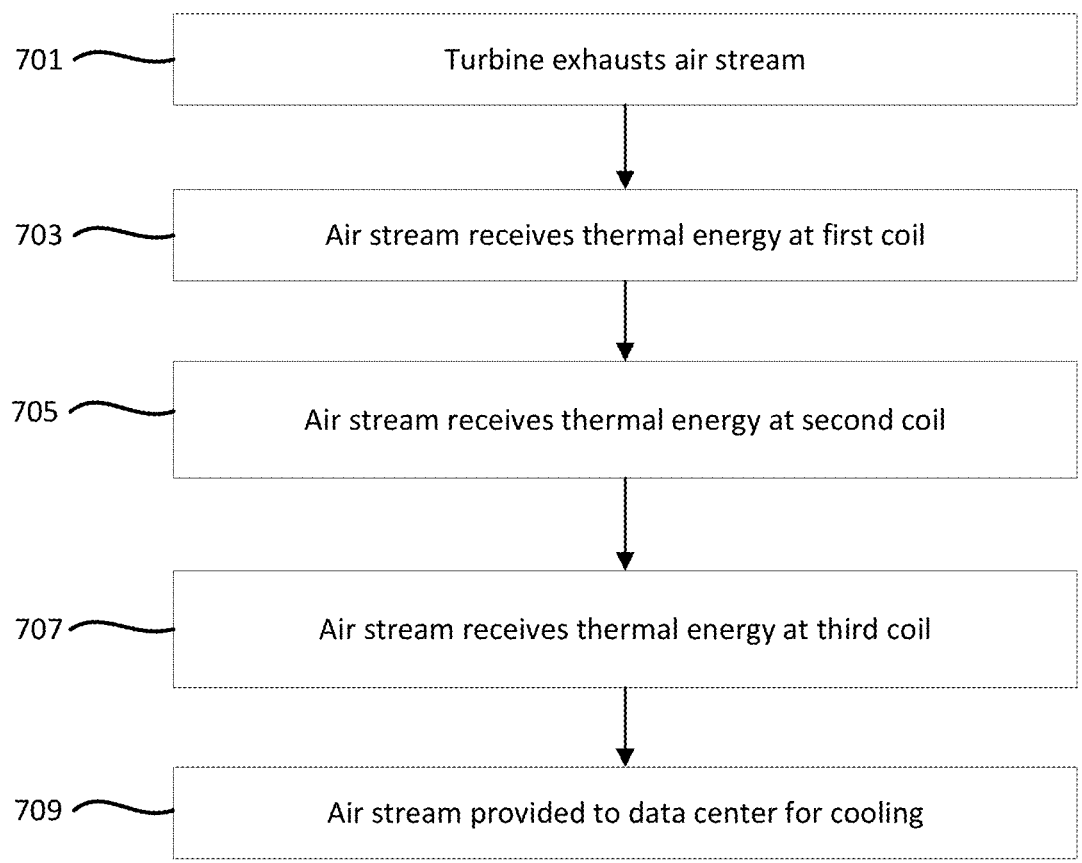
FIG. 7 illustrates an example method for performing heat transfer operations in a power supply and cooling system according to various embodiments of the present disclosure.

FIG. 7 illustrates an example method 700 for performing heat transfer operations in a power supply and cooling system according to various embodiments of the present disclosure. For ease of explanation, the method 700 is described as being performed using the systems 100, 200 of FIGS. 1 and 2. However, the method 700 may be used with any other suitable device or system. The embodiment shown in FIG. 7 is for illustration only. Other embodiments of the method 700 could be used without departing from the scope of this disclosure.

Referring to FIG. 7, at operation 701, a turbine exhausts an air stream at a low temperature. This can include, for example, the turbine 203 exhausting the air stream 204.

At operation 703, the air stream passes by or through a first coil and receives thermal energy from the first coil due to a relatively hotter fluid passing through the first coil. In some embodiments, the fluid moves in a fluid loop that includes a CCC coil associated with a data center. This can include, for example, the air stream 204 passing by or through the coil 212, through which fluid moves in a loop that includes the CCC coil 222.

At operation 705, the air stream passes by or through a second coil and receives thermal energy from the second coil due to a relatively hotter fluid passing through the second coil. In some embodiments, the fluid moves in a chilled fluid loop that includes one or more air handlers associated with the data center. This can include, for example, the air stream 204 passing by or through the coil 213, through which fluid moves in a chilled fluid loop that includes the air handlers 220.

At operation 707, the air stream passes by or through a third coil and receives thermal energy from the third coil due to a relatively hotter fluid passing through the third coil. In some embodiments, the fluid is heated in a fluid loop that includes one or more heaters, such as solar heaters. This can include, for example, the air stream 204 passing by or through the coil 214, through which heated fluid moves in a heated fluid loop that includes the heaters 206.

At operation 709, the air stream is provided to a data center, where the air stream can provide direct cooling to the data center. This can include, for example, the air stream 204 being provided to the data center 216 for direct cooling.

Figure 8:
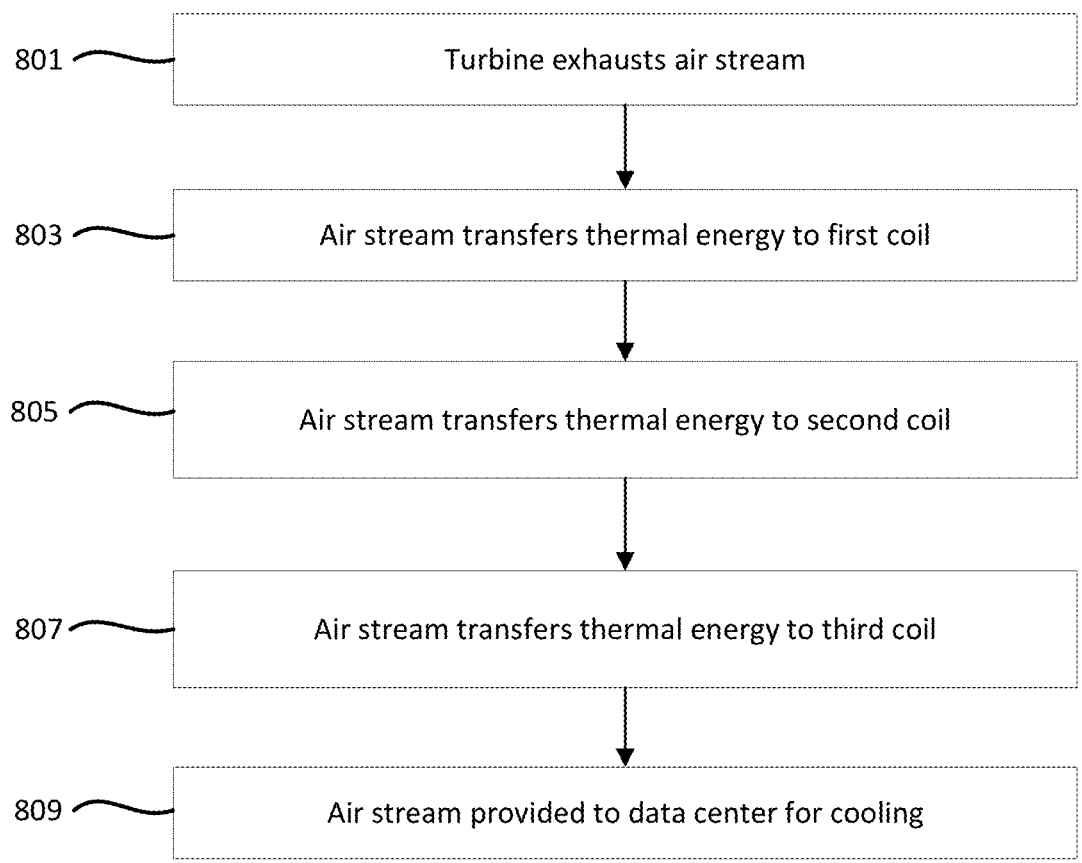
FIG. 8 illustrates another example method for performing heat transfer operations in a power supply and cooling system according to various embodiments of the present disclosure.

FIG. 8 illustrates another example method 800 for performing heat transfer operations in a power supply and cooling system according to various embodiments of the present disclosure. For ease of explanation, the method 800 is described as being performed using the systems 100, 300 of FIGS. 1 and 3. However, the method 800 may be used with any other suitable device or system. The embodiment shown in FIG. 8 is for illustration only. Other embodiments of the method 800 could be used without departing from the scope of this disclosure.

Referring to FIG. 8, at operation 801, a turbine exhausts an air stream at a relatively high temperature. This can include, for example, the turbine 303 exhausting the air stream 304.

At operation 803, the air stream passes by or through a first coil and transfers thermal energy to the first coil due to a relatively colder fluid passing through the first coil. In some embodiments, the fluid moves in a fluid loop coupled to a chiller, where the chiller operates to produce chilled fluid that is delivered to one or more air handlers associated with a data center. This can include, for example, the air stream 304 passing by or through the coil 312, through which fluid moves in a loop coupled to the chiller 322. The chiller 322 operates to produce chilled fluid that is delivered to the air handlers 324.

At operation 805, the air stream passes by or through a second coil and transfers thermal energy to the second coil due to a relatively colder fluid passing through the second coil. In some embodiments, the fluid moves in a fluid loop that includes a heat exchanger, where the other side of the heat exchanger is fluidly coupled to a district heating and cooling system. This can include, for example, the air stream 304 passing by or through the coil 313, through which fluid moves in a fluid loop that includes the heat exchanger 306.

At operation, 807, the air stream passes by or through a third coil and transfers thermal energy to the third coil due to a relatively colder fluid passing through the third coil. In some embodiments, the fluid moves in a fluid loop that includes a heat exchanger, where the other side of the heat exchanger is fluidly coupled to the district heating and cooling system and/or a surface water source. This can include, for example, the air stream 304 passing by or through the coil 314, through which fluid moves in a fluid loop that includes the heat exchanger 308.

At operation 809, the air stream is provided to a data center, where the air stream can provide direct cooling to the data center. This can include, for example, the air stream 304 being provided to the data center 316 for direct cooling.

The methods discussed above with regard to FIGS. 7 and 8 illustrate example operations that can be implemented in accordance with the principles of the present disclosure. Various changes could be made to the methods illustrated herein. For example, while shown as a series of steps, various steps in each figure could overlap, occur in parallel, occur in a different order, or occur multiple times. In another example, steps may be omitted or replaced by other steps.

Figure 9:
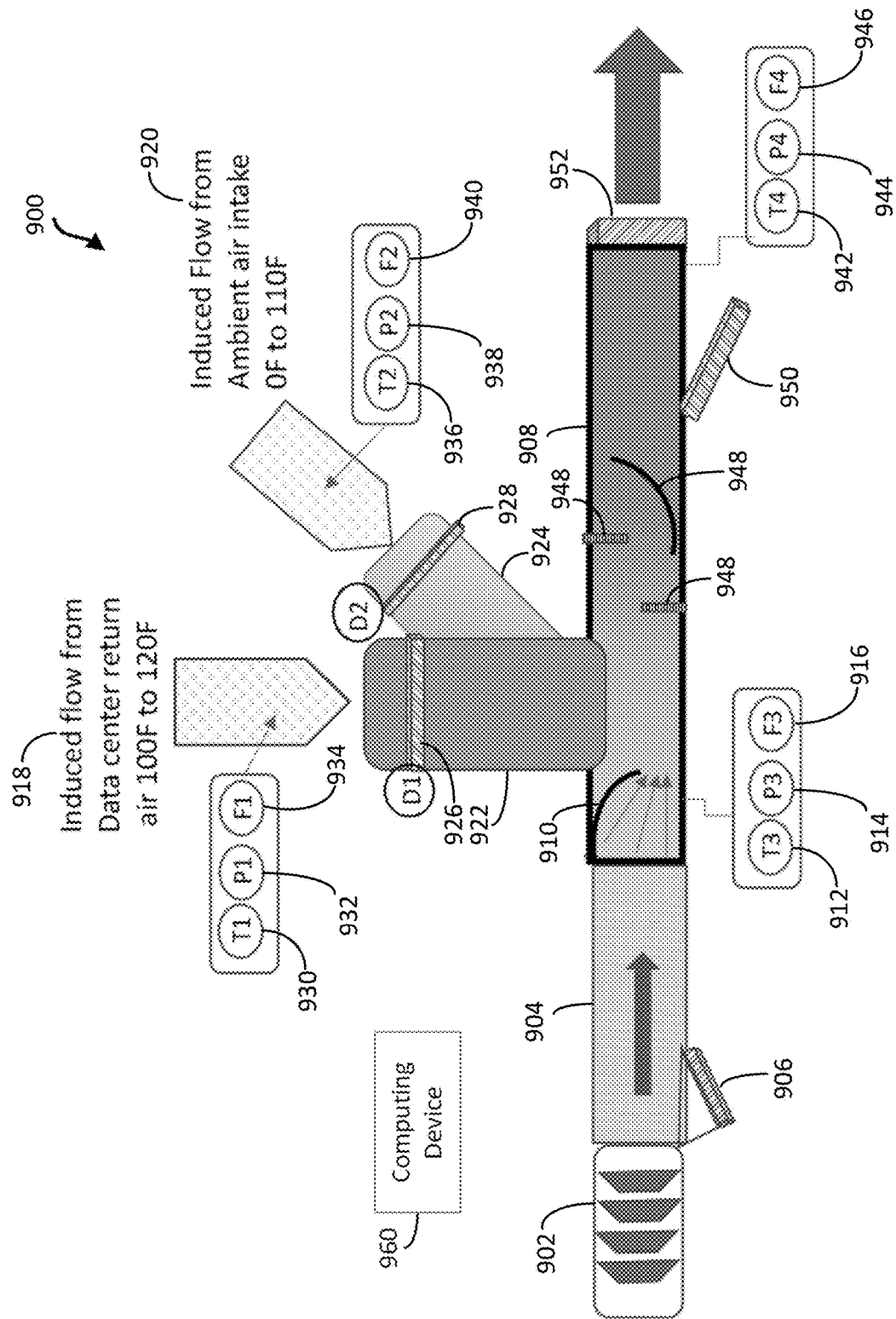
FIG. 9 illustrates an example system that uses air induction to condition prime mover exhaust according to various embodiments of the present disclosure.

FIG. 9 illustrates an example an example system 900 that uses air induction to condition prime mover exhaust according to various embodiments of the present disclosure. To achieve the correct supply air temperature for data center cooling without the use of common fluids to heat or cool the prime mover air stream through air-to-fluid transfers, the use of air induction via the Venturi effect can be employed. As described below, the mixing of available data center return air with ambient exterior air in calculated ratios can produce a prescribed LAT from the system 900 to the data center.

For ease of explanation, the system 900 is described as being used in conjunction with the power supply and cooling system 100 of FIG. 1. Of course, this is merely one example. The system 900 could be used with any other suitable system. Also, the embodiment of the system 900 shown in FIG. 9 is for illustration only. Other embodiments of the system 900 could be used without departing from the scope of this disclosure.

As illustrated in FIG. 9, the system 900 include a prime mover (or turbine) 902. The turbine 902 can represent (or be represented by) the power supply system 109 of FIG. 1. Depending on the embodiment, the turbine 902 can be part of a compressed air energy system or a liquid air energy system. When the turbine 902 is part of a compressed air energy system, the turbine 902 generates relatively cold exhaust at a temperature less than 30° F. In some embodiments, the exhaust stream of the turbine 902 is at a temperature of approximately −150° F. When the turbine 902 is part of a liquid air energy system, the turbine 902 generates relatively warm exhaust at a temperature greater than 30° F. In some embodiments, the exhaust stream of the turbine 902 is at a temperature of approximately 150° F.

The exhaust stream initially flows through a first duct 904 that includes a high-pressure waste gate 906 to expel excess exhaust. In some embodiments, the waste gate 906 is biased in an open position due to gravity and can be powered closed when required. The exhaust stream then enters a second duct 908, where the exhaust is mixed with other air, as described below. One or more vanes or baffles 910 disposed near the entrance to the second duct 908 constrict the air flow and cause a reduction in fluid pressure and an increase in fluid velocity (i.e., the Venturi effect). Sensors disposed near the entrance of the second duct 908 include a temperature sensor 912, a pressure sensor 914, and a flow sensor 916 for measuring the temperature, pressure, and flow rate, respectively, of the exhaust stream entering the second duct 908.

Additional air is introduced into the second duct 908 through induced flow. That is, because the exhaust stream from the turbine 902 is at a high pressure and velocity, the additional air can be drawn (or induced) into the second duct 908. The additional air sources include data center return air 918 and ambient outside air 920. In some embodiments, each air source 918 and 920 flows through a corresponding duct 922 and 924 before entering the second duct 908. Dampers 926 and 928 in each duct 922 and 924 can be operated to control the air flow from each duct 922 and 924 into the second duct 908. Sensors disposed in the air stream through each duct 922 and 924 include temperature sensors 930 and 936, pressure sensors 932 and 938, and flow sensors 934 and 940 for measuring the temperature, pressure, and flow rate, respectively, of the air streams in the ducts 922 and 924.

In the second duct 908, the exhaust stream from the first duct 904, the data center return air 918, and the ambient outside air 920 mix to form a single air stream. When the turbine 902 is part of a compressed air energy system, the temperature of the cold exhaust stream is raised due to the mixing with the relatively warmer data center return air 918 and ambient outside air 920. Conversely, when the turbine 902 is part of a liquid air energy system, the temperature of the warm exhaust stream is lowered due to the mixing with the relatively colder data center return air 918 and ambient outside air 920. One or more vanes or baffles 948 disposed within the second duct constrict or disturb the air flow, further causing mixture of the exhaust stream with the data center return air 918 and ambient outside air 920.

Sensors associated the second duct 908 include a temperature sensor 942, a pressure sensor 944, and a flow sensor 946 for measuring the temperature, pressure, and flow rate, respectively, of the combined air stream in the second duct 908. If any of the measured properties (i.e., temperature, pressure, or flow rate) is not within a desired range, the dampers can be operated to change the ratio of air streams (e.g., as a sensor-controlled damper). In addition, a waste gate 950 can be operated to release non-specification waste air from the second duct 908. In some embodiments, the waste gate 950 is biased in an open position due to gravity and can be powered closed when required. Exhaust air that is within the desired temperature, pressure, and flow rate range can be output through an outlet 952, and delivered to a data center (e.g., the electrical load 120 of FIG. 1) for cooling.

In some embodiments, the system 900 includes at least one computing device 960 provided to control operations of one or more components of the system 900. For example, the computing device 960 can obtain measurements from one or more of the sensors 912-916, 930-946, determine desired temperatures and/or air flow rates, and control operation of one or more dampers, waste gates, or the like to effect the desired change(s). In some embodiments, the computing device 960 may be a service operated by a third party such as a person or a company. The computing device 960 may be housed and operated at a location different than the location at which the rest of system 900 is located. That is to say, the computing device 960 is not bound to a specific location or configuration. While only one computing device 960 is shown in FIG. 9, the system 900 could actually include multiple computing devices 960, each providing control to a different part of the system 900.

The system 900 provides advantageous benefits compared to conventional mechanical systems using air induction. Such conventional systems typically employ high-power fans to create the necessary high-pressure, high-volume air stream to induce another air source into the air stream. In contrast, the system 900 does not require any high-power fans. Energy use is primarily limited to control systems (e.g., the computing device 960) and power actuated dampers.

It is noted that various figures and portions of the specification list example temperatures or temperature ranges. These are provided by way of example only and any suitable alternative temperature or temperature range may be used in embodiments of the present disclosure.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:
   a turbine configured to exhaust an air stream;
   a first coil configured to transfer thermal energy to the air stream when the air stream passes by or through the first coil, wherein the first coil is downstream of the turbine;
   a second coil configured to transfer thermal energy to the air stream when the air stream passes by or through the second coil, wherein the second coil is downstream of the first coil; and
   a third coil configured to transfer thermal energy to the air stream when the air stream passes by or through the third coil, wherein the third coil is downstream of the second coil,
   wherein the air stream is configured to cool one or more electronic components of a data center that is downstream of the third coil, and
   wherein the first coil is part of a first fluid loop that includes a close coupled cooling (CCC) coil associated with the data center.

2. The system of claim 1, wherein the second coil is part of a second fluid loop that includes one or more air handlers associated with the data center.

3. The system of claim 2, wherein the third coil is part of a third fluid loop that includes one or more heat sources configured to heat a fluid conveyed in the third fluid loop.

4. The system of claim 3, wherein the one or more heat sources comprise at least one of: a solar heater, a hydrogen fueled heater, and exhaust or heat rejection from an internal combustion engine.

5. The system of claim 2, wherein a portion of the first fluid loop is common with a portion of the second fluid loop such that a portion of fluid conveyed in the first fluid loop and passing through the first coil also passes through the second coil.

6. The system of claim 1, further comprising:
   a heat exchanger configured to transfer thermal energy from fluid conveyed in the first fluid loop to a district heating and cooling system.

7. The system of claim 1, further comprising:
   a duct configured to receive at least a portion of the air stream exhausted from the turbine; and
   one or more generators disposed in the duct and configured to generate power from at least the portion of the air stream.

8. A method comprising:
   exhausting an air stream from a turbine;

transferring thermal energy from a first coil to the air stream when the air stream passes by or through the first coil, wherein the first coil is downstream of the turbine;

transferring thermal energy from a second coil to the air stream when the air stream passes by or through the second coil, wherein the second coil is downstream of the first coil;

transferring thermal energy from a third coil to the air stream when the air stream passes by or through the third coil, wherein the third coil is downstream of the second coil; and cooling one or more electronic components of a data center using the air stream, wherein the data center is downstream of the third coil, and wherein the first coil is part of a first fluid loop that includes a close coupled cooling (CCC) coil associated with the data center.

9. The method of claim 8, wherein the second coil is part of a second fluid loop that includes one or more air handlers associated with the data center.

10. The method of claim 9, wherein the third coil is part of a third fluid loop that includes one or more heat sources configured to heat a fluid conveyed in the third fluid loop.

11. The method of claim 10, wherein the one or more heat sources comprise at least one of: a solar heater, a hydrogen fueled heater, and exhaust or heat rejection from an internal combustion engine.

12. The method of claim 9, wherein a portion of the first fluid loop is common with a portion of the second fluid loop such that a portion of fluid conveyed in the first fluid loop and passing through the first coil also passes through the second coil.

13. The method of claim 8, further comprising: transferring thermal energy from fluid conveyed in the first fluid loop to a district heating and cooling system using a heat exchanger.

14. The method of claim 8, further comprising:

receiving, in a duct, at least a portion of the air stream exhausted from the turbine; and generating power from at least the portion of the air stream using one or more generators disposed in the duct.

* * * * *